United States Patent
Kuo

(10) Patent No.: US 12,126,360 B2
(45) Date of Patent: Oct. 22, 2024

(54) APPARATUS AND METHOD FOR GENERATING LOW-DENSITY PARITY-CHECK (LDPC) CODE

(71) Applicant: Silicon Motion, Inc., Zhubei (TW)

(72) Inventor: Shiuan-Hao Kuo, New Taipei (TW)

(73) Assignee: SILICON MOTION, INC., Zhubei (TW)

( * ) Notice: Subject to any disclaimer, the term of this patent is extended or adjusted under 35 U.S.C. 154(b) by 0 days.

(21) Appl. No.: 18/207,233

(22) Filed: Jun. 8, 2023

(65) Prior Publication Data
US 2023/0421178 A1 Dec. 28, 2023

(30) Foreign Application Priority Data
Jun. 23, 2022 (CN) .......................... 202210715236.8

(51) Int. Cl.
*H03M 13/11* (2006.01)
*H03K 19/173* (2006.01)
*H03K 19/21* (2006.01)

(52) U.S. Cl.
CPC .... *H03M 13/1177* (2013.01); *H03K 19/1737* (2013.01); *H03K 19/215* (2013.01)

(58) Field of Classification Search
CPC ......... H03M 13/1177; H03M 13/1102; H03M 13/116; H03M 13/611; H03M 13/616; H03K 19/1737; H03K 19/215; G06F 11/1012; G06F 12/0246
USPC ................................................ 714/755, 758
See application file for complete search history.

(56) References Cited

U.S. PATENT DOCUMENTS

| | | | | |
|---|---|---|---|---|
| 7,752,529 B2* | 7/2010 | Lee | ................... | H03M 13/6502 |
| | | | | 714/752 |
| 2004/0034828 A1* | 2/2004 | Hocevar | .............. | H03M 13/118 |
| | | | | 714/800 |
| 2008/0052593 A1* | 2/2008 | Lee | .................... | H03M 13/1105 |
| | | | | 714/758 |
| 2010/0281335 A1* | 11/2010 | Blanksby | ........... | H03M 13/1185 |
| | | | | 714/755 |

(Continued)

FOREIGN PATENT DOCUMENTS

| CN | 102340318 A | 2/2012 |
|---|---|---|
| CN | 103023516 A | 4/2013 |

(Continued)

*Primary Examiner* — Albert Decady
*Assistant Examiner* — Osman M Alshack
(74) *Attorney, Agent, or Firm* — Birch, Stewart, Kolasch & Birch, LLP

(57) ABSTRACT

The invention relates to an apparatus and a method for generating a Low-Density Parity-Check (LDPC) code. The apparatus includes: a LDPC encoder, a look-ahead circuitry and an exclusive-OR (XOR) calculation circuitry. The LDPC encoder is arranged operably to encode a front part of a user data using a 2-stage encoding algorithm with a parity check matrix to generate a first calculation result. The look-ahead circuitry is arranged operably to perform a dot product operation on a rear part of the user data and one of a plurality of feature rows corresponding to the parity check matrix to generate a second calculation result in each iteration. The XOR calculation circuitry is arranged operably to perform an XOR operation on the first calculation result and the second calculation result to generate a front part of the LDPC code.

20 Claims, 10 Drawing Sheets

(56) References Cited

U.S. PATENT DOCUMENTS

| | | | | |
|---|---|---|---|---|
| 2012/0243600 A1* | 9/2012 | Jeong | .................... | H04L 1/0057 |
| | | | | 375/240 |
| 2013/0179757 A1* | 7/2013 | Kamiya | ............ | H03M 13/6561 |
| | | | | 714/776 |
| 2014/0281790 A1* | 9/2014 | Li | ..................... | H03M 13/1171 |
| | | | | 714/755 |
| 2021/0181972 A1* | 6/2021 | Li | ........................... | G06F 13/28 |
| 2023/0378979 A1* | 11/2023 | Anderson | ......... | H03M 13/1515 |

FOREIGN PATENT DOCUMENTS

| | | |
|---|---|---|
| CN | 111162797 A | 5/2020 |
| CN | 113765623 B | 6/2022 |

\* cited by examiner (A)

(B)

APPARATUS AND METHOD FOR GENERATING LOW-DENSITY PARITY-CHECK (LDPC) CODE

CROSS-REFERENCE TO RELATED APPLICATIONS

This application claims the benefit of priority to Patent Application No. 202210715236.8, filed in China on Jun. 23, 2022; the entirety of which is incorporated herein by reference for all purposes.

BACKGROUND

The disclosure generally relates to storage devices and, more particularly, to an apparatus and a method for generating Low-Density Parity-Check (LDPC) code.

Flash memory devices typically include NOR flash devices and NAND flash devices. NOR flash devices are random access-a central processing unit (CPU) accessing a NOR flash device can provide the device any address on its address pins and immediately retrieve data stored in that address on the device's data pins. NAND flash devices, on the other hand, are not random access but serial access. It is not possible for NAND to access any random address in the way described above. Instead, the CPU has to write into the device a sequence of bytes which identifies both the type of command requested (e.g. read, write, erase, etc.) and the address to be used for that command. The address identifies a page (the smallest chunk of flash memory that can be written in a single operation) or a block (the smallest chunk of flash memory that can be erased in a single operation), and not a single byte or word. Improving the accuracy of data transmission to the flash module has always been an important issue affecting the overall performance of the flash controller. Thus, it is desirable to have an apparatus and a method for generating LDPC code to improve the accuracy of data transmission to the flash module.

SUMMARY

The disclosure relates to an apparatus for generating a Low-Density Parity-Check (LDPC) code to include: a LDPC encoder, a look-ahead circuitry and an exclusive-OR (XOR) calculation circuitry. The LDPC encoder is arranged operably to encode a front part of a user data using a 2-stage encoding algorithm with a parity check matrix to generate a first calculation result. The look-ahead circuitry is arranged operably to perform a dot product operation on a rear part of the user data and one of a plurality of feature rows corresponding to the parity check matrix to generate a second calculation result in each iteration. The XOR calculation circuitry is arranged operably to perform an XOR operation on the first calculation result and the second calculation result to generate a front part of the LDPC code.

The disclosure relates to a method for generating an LDPC code, performed by a controller coupled to a switch, a LDPC encoder and a look-ahead circuitry, to include: controlling the switch for a rear part of a user data to be fed into the look-ahead circuitry and issuing a first signal to the LDPC encoder to activate a second stage of encoding when a front part of the user data is transmitted to the LPDC encoder completely; and issuing a second signal to the LDPC encoder to start outputting a first calculation result to an XOR calculation circuitry and issuing a third signal to the look-ahead circuitry to start outputting a second calculation result to the XOR calculation circuitry when the rear part of the user data is transmitted to the look-ahead circuitry completely. The LDPC encoder is arranged operably to encode the front part of the user data using a 2-stage encoding algorithm with a parity check matrix to generate the first calculation result. The look-ahead circuitry is arranged operably to perform a dot product operation on the rear part of the user data and one of a plurality of feature rows corresponding to the parity check matrix to generate the second calculation result in each iteration. The XOR calculation circuitry is arranged operably to perform an XOR operation on the first calculation result and the second calculation result to generate a front part of the LDPC code.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent." etc.)

Figure 1:
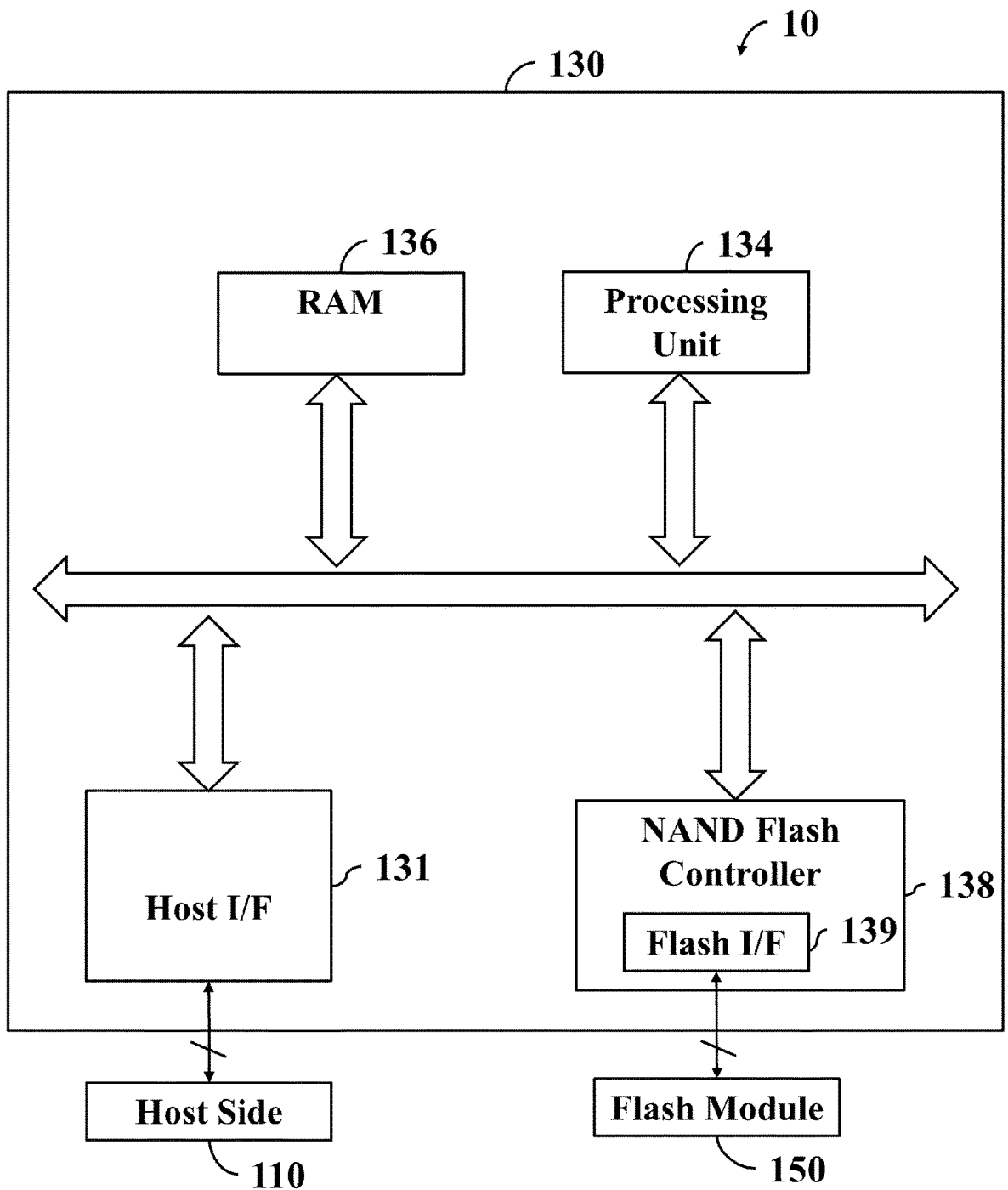
FIG. 1 is the system architecture of an electronic apparatus according to an embodiment of the invention.

Refer to FIG. 1. The electronic apparatus 10 includes the host side 110, the flash controller 130 and the flash module 150, and the flash controller 130 and the flash module 150 may be collectively referred to as a device side. The electronic apparatus 10 may be practiced in a Personal Computer (PC), a laptop PC, a tablet PC, a mobile phone, a digital camera, a digital recorder, smart television, smart refrigerator, or other consumer electronic products. The host side 110 and the host interface (I/F) 131 of the flash controller 130 may communicate with each other by Universal Serial Bus (USB), Advanced Technology Attachment (ATA), Serial Advanced Technology Attachment (SATA), Peripheral Component Interconnect Express (PCI-E), Universal Flash Storage (UFS), Embedded Multi-Media Card (eMMC) protocol, or others. The flash I/F 139 of the NAND flash controller (NFC) 138 and the flash module 150 may communicate with each other by a Double Data Rate (DDR) protocol, such as Open NAND Flash Interface (ONFI), DDR Toggle, or others. The flash controller 130 includes the processing unit 134 and the processing unit 134 may be implemented in numerous ways, such as with general-purpose hardware (e.g., a microcontroller unit, a single processor, multiple processors or graphics processing units capable of parallel computations, or others) that is programmed using firmware and/or software instructions to perform the functions recited herein. The processing unit 134 receives host commands, such as host read, write, discard, trim, erase commands, through the host I/F 131, schedules and executes these commands. The flash controller 130 includes the Random Access Memory (RAM) 136 and the RAM 136 may be implemented in a Dynamic Random Access Memory (DRAM), a Static Random Access Memory (SRAM), or the combination thereof, for allocating space as a data buffer storing user data (also referred to as host data) that is to be programmed into the flash module 150, and has been read from the flash module 150 and is to be output to the host side 110. The RAM 136 stores necessary data in execution, such as variables, data tables, data abstracts, host-to-flash (H2F) tables, flash-to-host (F2H) tables, and so on. The NFC 138 provides functions that are required to access to the flash module 150, such as a command sequencer, a Low-Density Parity-Check (LDPC) encoder/decoder, etc.

A bus architecture may be configured in the flash controller 130 for coupling between components to transfer data, addresses, control signals, etc., which include the host I/F 131, the processing unit 134, the RAM 136, the NFC 138, and so on. The bus includes a set of parallel physical-wires connected to two or more components of the flash controller 130. The bus is a shared transmission medium so that only two devices can access to the wires to communicate with each other for transmitting data at any one time. Data and control signals travel in both directions between the components along data and control lines, respectively. Addresses on the other hand travel only one way along address lines. For example, when the processing unit 134 wishes to read data from a particular address of the RAM 136, the processing unit 134 sends this address to the RAM 136 on the address lines. The data of that address is then returned to the processing unit 134 on the data lines. To complete the data read operation, control signals are sent along the control lines.

The flash module 150 provides huge storage space typically in hundred Gigabytes (GB), or even several Terabytes (TB), for storing a wide range of user data, such as high-resolution images, video files, etc. The flash module 150 includes control circuits and memory arrays containing memory cells that can be configured as Single Level Cells (SLCs), Multi-Level Cells (MLCs), Triple Level Cells (TLCs), Quad-Level Cells (QLCs), or any combinations thereof. The processing unit 134 programs user data into a designated address (a destination address) of the flash module 150 and reads user data from a designated address (a source address) thereof through the flash I/F 139. The flash I/F 139 may use several electronic signals run on physical wires including data lines, a clock signal line and control signal lines for coordinating the command, address and data transfer with the flash module 150. The data lines may be used to transfer commands, addresses, read data and data to be programmed; and the control signal lines may be used to transfer control signals, such as Chip Enable (CE), Address Latch Enable (ALE), Command Latch Enable (CLE), Write Enable (WE), etc.

Figure 2:
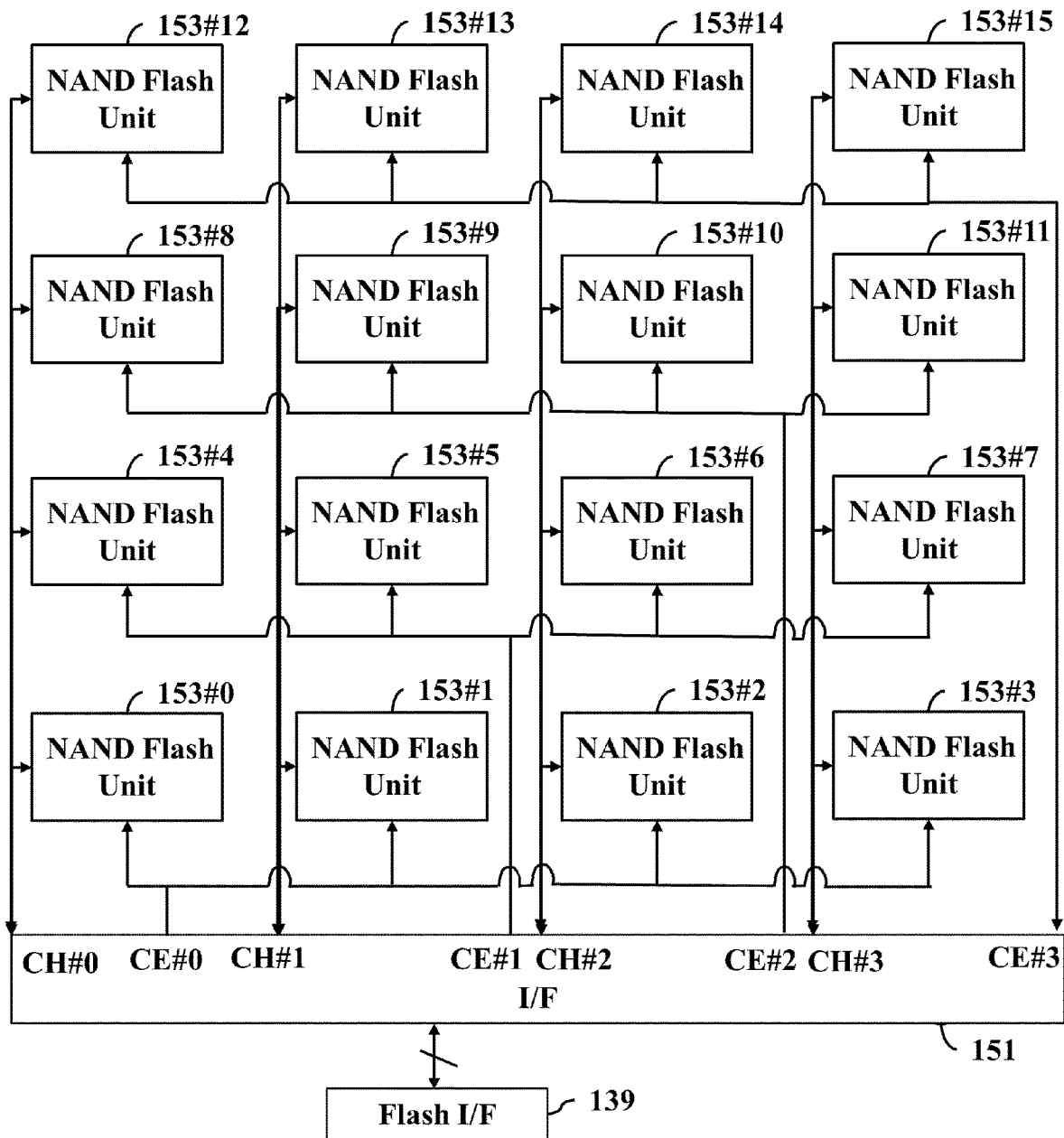
FIG. 2 is a schematic diagram illustrating a flash module according to an embodiment of the invention.

Refer to FIG. 2. The flash I/F 151 may include four I/O channels (hereinafter referred to as channels) CH #0 to CH #3 and each is connected to four NAND flash units, for example, the channel CH #0 is connected to the NAND flash units 153 #0, 153 #4, 153 #8 and 153 #12. Each NAND flash unit can be packaged in an independent die. The flash I/F 139 may issue one of the CE signals CE #0 to CE #3 through the I/F 151 to activate the NAND flash units 153 #0 to 153 #3, the NAND flash units 153 #4 to 153 #7, the NAND flash units 153 #8 to 153 #11, or the NAND flash units 153 #12 to 153 #15, and read data from or program data into the activated NAND flash units in parallel. Those artisans may modify the design of the flash modules 150 to include more or less channels, and/or make each channel connect more or less NAND flash units according to different system requirements, and the invention should not be limited thereto.

The NFC 138 includes an LDPC encoder capable of generating LDPC code according to user data, which is a linear error correcting code. For example, the generation of LDPC code can be expressed with the following formula:

$$MSG_{1 \times n} \odot (PCM_{n \times (n+m)}) = CW_{1 \times (n+m)}$$

where $MSG_{1 \times n}$ represents a 1-row, n-column matrix of user data, $PCM_{n \times (n+m)}$ represents a n-row, (n+m)-column of parity check matrix, $CW_{1 \times (n+m)}$ represents a 1-row, (n+m)-column matrix of final codeword, and $\odot$ represents a modulo 2 multiplication. The parity check matrix may include a Quasi-Cyclic (QC) structure. The value of the first n bits in $CW_{1 \times (n+m)}$ is equal to the value of $MSG_{1 \times n}$ and the value of the last m bits in $CW_{1 \times (n+m)}$ is referred to as LDPC code. An example is as follows:

$$(1\ 0\ 1) \odot \begin{pmatrix} 1 & 0 & 0 & 1 & 0 & 1 \\ 0 & 1 & 0 & 1 & 1 & 1 \\ 0 & 0 & 1 & 1 & 1 & 0 \end{pmatrix} = (1\ 0\ 1\ 0\ 1\ 1)$$

Those artisans know that a well-known efficient algorithm (such as 2-stage encoding, etc.) with a corresponding parity check matrix can be used to generate the LDPC code.

Figure 3:
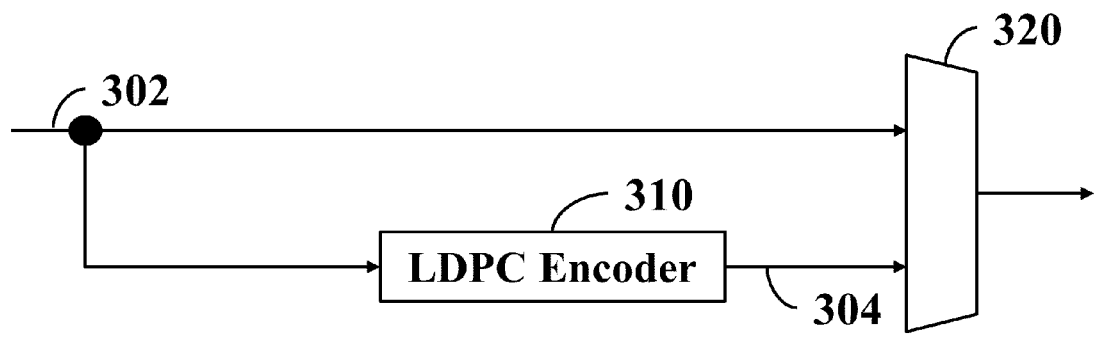
FIG. 3 is a schematic diagram illustrating the encoding and the transmission for user data and a Low-Density Parity-Check (LDPC) code according to some implementations.
Figure 3:
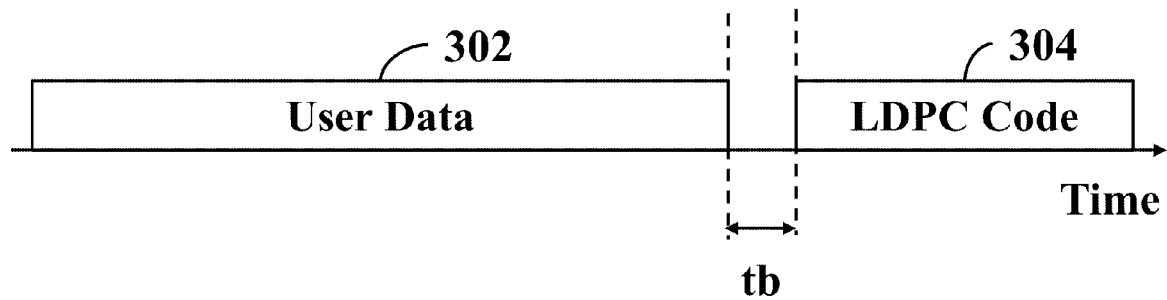

Refer to the part (A) in FIG. 3. In some implementations, the NFC 138 may include the LDPC encoder 310 and the multiplexer (MUX) 320. The LDPC encoder 310 encodes a fixed-length user data 302 into a fixed-length LDPC code 304 with a predefined parity check matrix, for example, encodes 2 kilobytes (KB) of user data 302 into 512 bytes of LDPC code 304. Initially, the MUX 230 is employed to output the user data 302 to the flash module 150. After a transmission completion of the user data 302, the MUX 320 is controlled to output the LDPC code 304 to the flash module 150. However, refer to the part (B) in FIG. 3, with some algorithms realized in the LDPC encoder 310, after receiving the complete user data 302, the LDPC encoder 310 requires to calculate for a time period tb to generate the LDPC code 304, so that the LDPC code 304 can start to be transmitted to the flash module 150. This period of calculation time tb is also called a timing bubble. For example, in the 2-stage encoding, the parity check matrix is divided into two matrixes, H=[H1, H2]. In the first stage, the dot product operation is performed on the user data (also called message bits) and the first matrix H1 to generate a partial parity. In the second stage, the dot product operation is performed on the partial parity and the inverse matrix $H2^T$ of the second matrix H2 to generate the LDPC code 304. Since the second stage requires the dot product operation on an inverse matrix and others, the calculation complexity is relatively high. Therefore, the LDPC encoder 310 needs to calculate for a time period to obtain the LDPC code 304, causing the timing bubble. However, the running of the high-speed transmission I/F cannot be interrupted. If there is a timing bubble in the process of transmitting data to the flash module 150, the data transmitted to the flash module 150 is prone to errors.

Figure 4:
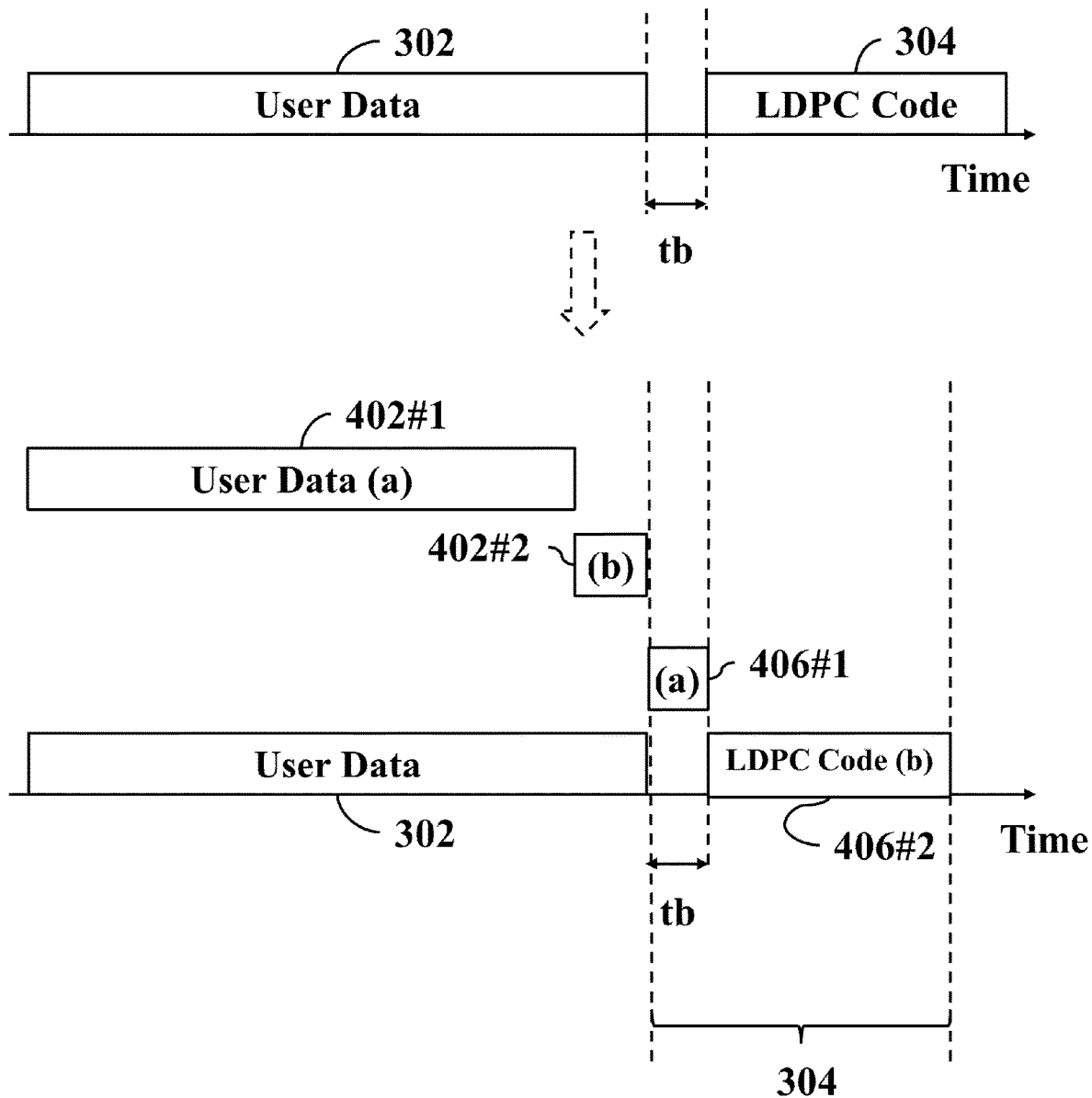
FIG. 4 is a schematic diagram for eliminating a timing bubble between transmissions of user data and an LDPC code according to an embodiment of the invention.

To eliminate the aforementioned timing bubble, refer to FIG. 4. An embodiment of the invention introduces an apparatus and a method for generating LDPC code to eliminate the timing bubble tb as shown in FIG. 3. Although the specification describes the shortcomings of the above implementation, this is only used to illustrate the inspiration of embodiments of the present invention as follows. Those artisans can apply the technical solutions to solve other technical problems or be applicable to other technical environments, and the invention should not be limited thereto. Since the LDPC encoder 310 requires to run for a fixed period of time tb before it can start to output the completed LDPC code, an embodiment of the invention divides the final LDPC code 304 into two parts: the front part (a) 406 #1 and the rear part (b) 406 #2. The length of front part (a) 406 #1 depends on the length of timing bubble tb. For example, if the LDPC encoder 310 needs 2 clock cycles to start outputting the LDPC code 304 and can output 4 B data to the flash module 150 per clock cycle, then the length of front part (a) 406 #1 of the LDPC code 304 is fixed to 8 B. The whole user data 302 can be divided into two parts: the front part (a) 402 #1 and the rear part (b) 402 #2. Two circuitries are used to encode the front part (a) 406 #1 and the rear part (b) 406 #2 of the LDPC code 304 for the front part (a) 402 #1 and the rear part (b) 402 #2 of the user data 302, respectively.

Figure 5:
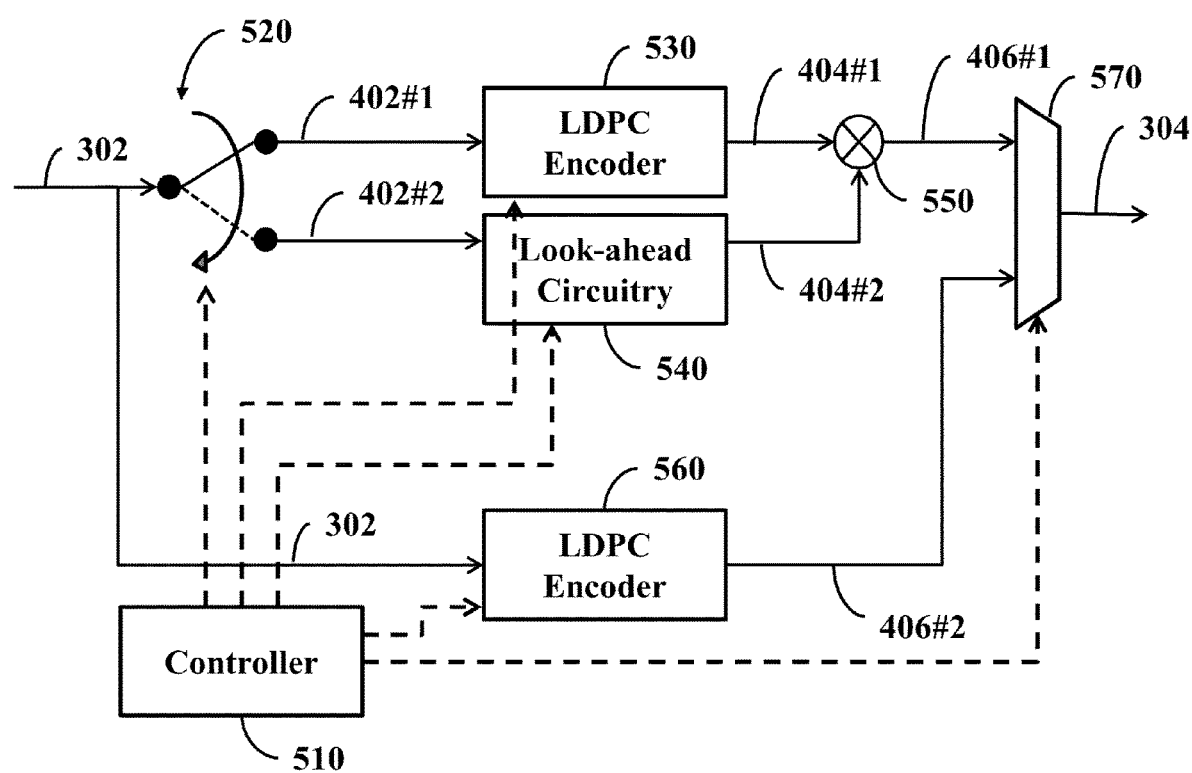
FIG. 5 is a block diagram showing an apparatus for generating an LDPC code according to an embodiment of the invention.

Refer to FIG. 5 showing an apparatus for generating an LDPC code. One circuitry includes the LDPC encoder 560 (like the LDPC encoder 310 in previous implementations) to encode the rear part (b) 406 #2 of LDPC code 304 by using the 2-stage encoding algorithm with the predefined parity check matrix. Another circuitry includes the switch 520, the LDPC encoder 530, the look-ahead circuitry 540, the exclusive-OR (XOR) calculation circuitry 550 and the MUX 570 to quickly encode the front part (a) 406 #1 of LDPC code 304 with the predefined parity check matrix for the user data 302, so that the front part (a) 406 #1 and the rear part (b) 406 #2 of LDPC code 304 can be transmitted to the flash module 150 instantly after the rear part (b) of the user data 302 is transmitted to the flash module 150. No timing bubble is appeared between the transmissions of the user data 302 and the LDPC code 304 (as shown in the lower part of FIG. 4).

The switch 520 includes one input terminal and two output terminals, the input terminal is used to receive the user data 302, one output terminal is coupled to the input terminal of the LDPC encoder 530 and the other output terminal is coupled to the input terminal of the look-ahead circuitry 540. The switch 520 is selectively coupled to the input terminal of the LDPC encoder 530 or the look-ahead circuitry 540 under the control of the controller 510. The controller 510 controls the switch 520 to feed the user data 302 into the LDPC encoder 530 before the user data 302 is encoded. Subsequently, the controller 510 controls the switch 302 to allow the rear part (b) of the user data 302 to feed the rear part (b) of the user data 302 into the LDPC encoder 530 after the front part (a) 402 #1 of the user data 302 is fed into the LDPC encoder 530 completely. The LDPC encoder 530 uses the 2-stage encoding algorithm with the predefined parity check matrix to encode the front part (a) of the user data 302 to generate encoded data 404 #1. The controller 510 instructs the LDPC encoder 530 to start the second stage of encoding when most of parity for the front part (a) 402 #1 of the user data 302 is calculated (that is, early start the second stage of encoding). Since the rear part (b) 402 #2 of the user data 302 is not fed into the LDPC encoder 530 during the second stage of encoding, the look-ahead circuitry 540 performs the dot product operation on the rear part (b) 402 #2 of the user data 302 and a feature row corresponding to the parity check matrix to generate encoded data 404 #2 for compensating a calculation result 404 #1 by the LDPC encoder 530. It is to be noted that, since those artisans know that the dot product operation described in the specification is performed in the binary field, the dot product operation herein is equivalent to the modulo 2 multiplication. The XOR calculation circuitry 550, coupled to the output terminals of the LDPC encoder 530 and the look-ahead circuitry 540, bitwise performs the XOR operation on the output 404 #1 of the LDPC encoder 530 and the output 404 #2 of the look-ahead circuitry 540, for example, the XOR operation is performed on 8B of output 404 #1 and 8B of output 404 #2 per batch. The MUX 570 includes two input terminals and one output terminal, one input terminal is coupled to the output terminal of the XOR calculation circuitry 550, the other input terminal is coupled to the output terminal of the LDPC encoder 560, and the output terminal is coupled to the flash module 150. At the beginning of generating the LDPC code, or after the rear part (b) 402 #2 of the user data 302 is fed into the look-ahead circuitry 540 completely, the controller 510 controls the MUX 570 to couple the output terminal of the XOR calculation circuitry 550 to the flash module 150, so that the calculation result (i.e. the front part (a) 406 #1 of the LDPC code 304) by the XOR calculation circuitry 550 is output to be flash module 150. After the front part (a) 406 #1 of the LDPC code 304 is output to the flash module 150 completely, the controller 510 controls the MUX 570 to couple the output terminal of the LDPC encoder 560 to the flash module 150, so that the calculation result (i.e. the rear part (b) 406 #2 of the LDPC code 304) by the LDPC encoder 560 is output to the flash module 150.

Figure 6:
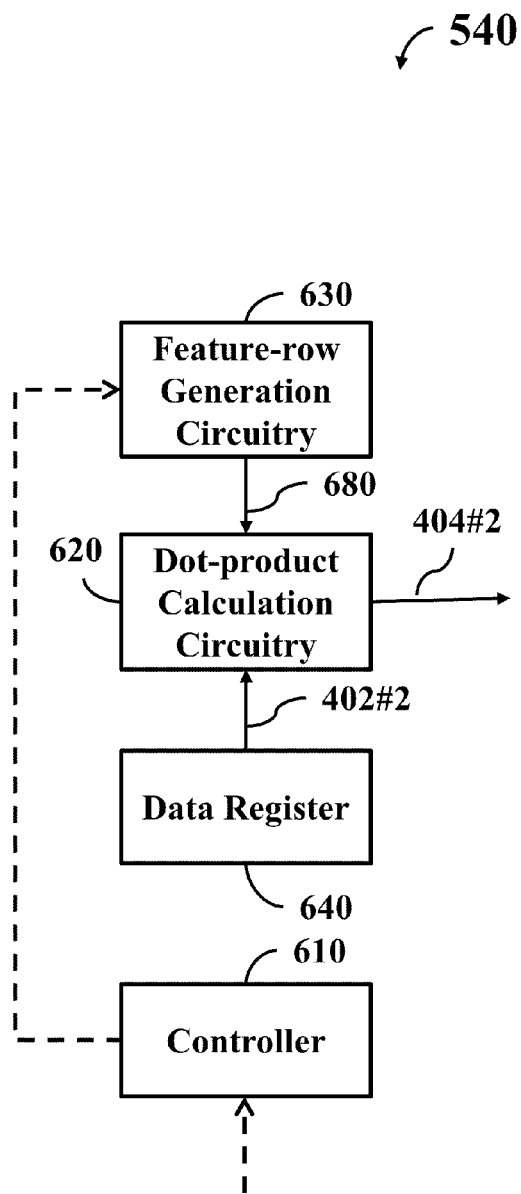
FIG. 6 is a block diagram showing a look-ahead circuitry according to an embodiment of the invention.
Figure 9:
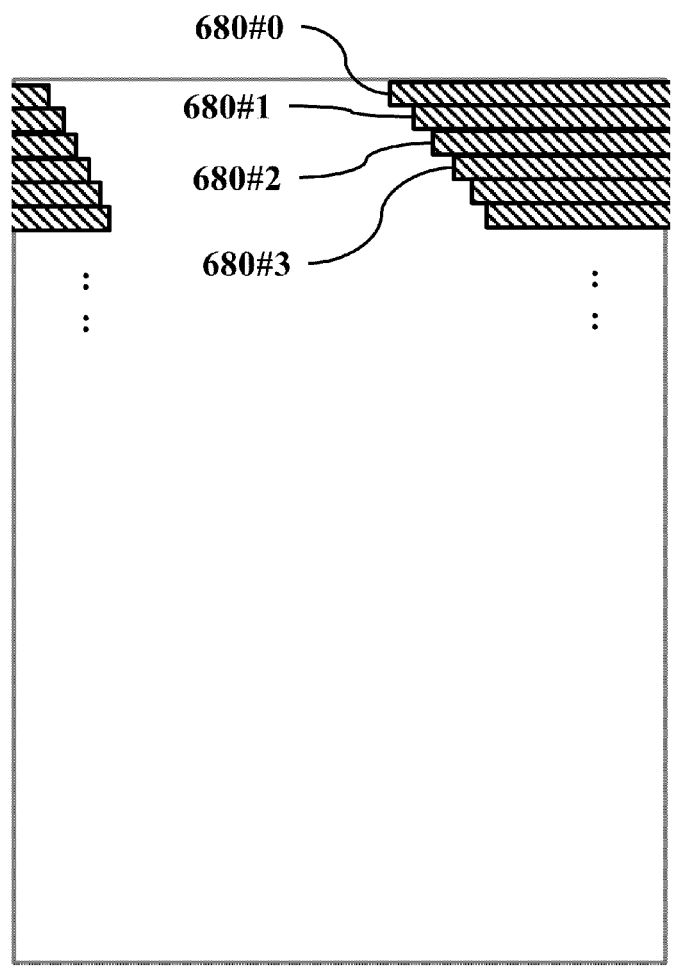
FIG. 9 is a schematic diagram illustrating feature rows according to an embodiment of the invention.

Refer to FIG. 6 showing an embodiment of the look-ahead circuitry 540 including the controller 610, the dot-product calculation circuitry 620, the feature-row generation circuitry 630 and the data register 640. The data register 640 is used to store the rear part (b) 402 #2 of the user data 302. The feature-row generation circuitry 630 includes a source register for storing a look-ahead basis whose length is predefined as $|m_2|+|p_a|-1$, where $m_2$ represents the length of the rear part (b) 402 #2 of the user data 302 and $p_a$ represents the length of the front part (a) 406 #1 of the LDPC code 304. The look-ahead basis is derived from the parity check matrix and includes the subset in the parity check matrix, which is required for encoding the rear part (b) 402 #2 of the user data 302. Additionally, the length of the feature row 680 equals the length of the rear part (b) 402 #2 of the user data 302. For example, assumed that the rear part (b) 402 #2 of the user data 302 is 8 B (i.e. 64 bits) long and the front part (a) 406 #1 of the LDPC code 304 is 8 B (i.e. 64 bits) long: The length of the source register is 127 bits and the length of the feature row 680 is 8 B (i.e. 64 bits). Since the parity check matrix contains the QC structure, except for the initial iteration, the feature row used for calculation in each iteration is the result that the previous feature row is cyclical right shifted by one bit. Refer to FIG. 9 showing a schematic diagram of the feature rows. Each row represents one look-ahead basis and the back slashed portion in each row represents the feature row 680 in the corresponding look-ahead basis. The feature row 680 #1 is the result that the feature row 680 #0 is cyclical right shifted by one bit, the feature row 680 #2 is the result that the feature row 680 #1 is cyclical right shifted by one bit, and so on. The feature-row generation circuitry 630 includes the circuitry for obtaining one feature row 680 from the corresponding look-ahead basis, which is required in each iteration. In each iteration, the controller 610 issues a control signal to the feature-row generation circuitry 630 for driving the feature-row generation circuitry 630 to output the feature row 680 that is required in this iteration. The dot-product calculation circuitry 620, coupled to the feature-row generation circuitry 630 and the data register 640, performs the dot product operation on the feature row output from the feature-row generation circuitry 630 and the value stored in the data register 640 in each iteration to obtain the calculation result 404 #2 and outputs the calculation result 404 #2 to the XOR calculation circuitry 550.

Figure 7:
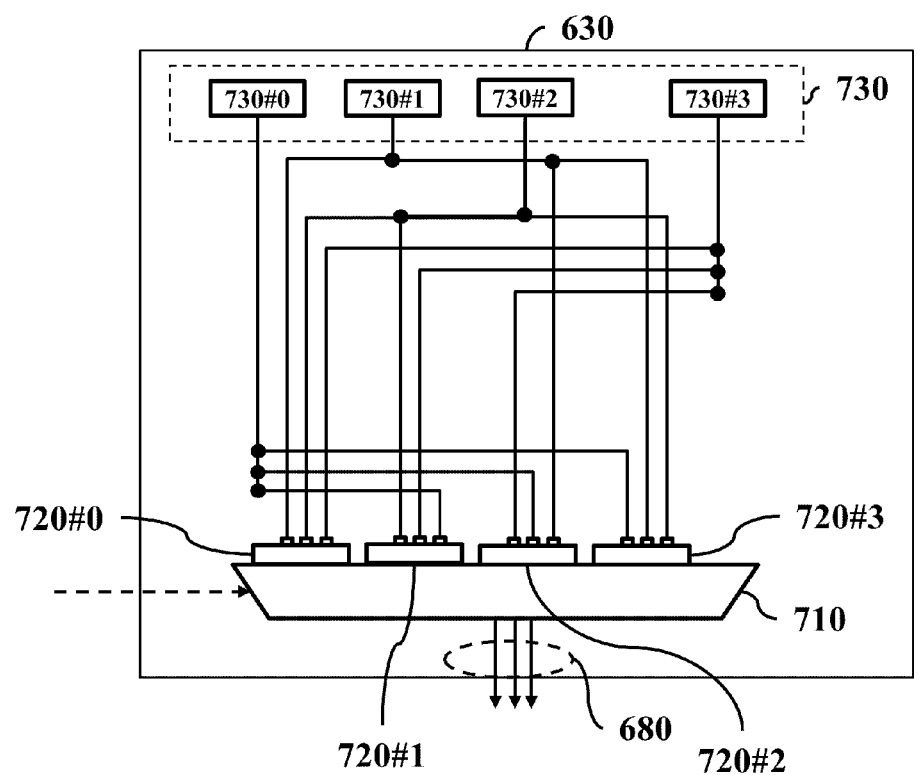
FIGS. 7 and 8 are block diagrams showing feature-row generation circuitries according to embodiments of the invention.

Refer to FIG. 7 showing an embodiment of the feature-row generation circuitry 630 including the MUX 710 and the source register 730. Initially, the source register 730 stores a preset look-ahead basis. The MUX 710 includes multiple input ports and one output port, and each input port is connected to a preset number of registers in the source register 730 through the preset number of physical lines in a specified order, respectively. For example, the input port 720 #0 of the MUX 710 is sequentially connected to the registers 730 #1, 730 #2 and 730 #3 through physical lines, the input port 720 #1 of the MUX 710 is sequentially connected to the registers 730 #2, 730 #3 and 730 #0 through physical lines, the input port 720 #2 of the MUX 710 is sequentially connected to the registers 730 #3, 730 #0 and 730 #1 through physical lines, and the input port 720 #3 of the MUX 710 is sequentially connected to the registers 730 #0, 730 #1 and 730 #2 through physical lines. In the first iteration, the MUX 710 receives the control signal to connect the input port 720 #0 to the output port for outputting the value in the registers 730 #1, 730 #2 and 730 #3 as the feature row 680. In the second iteration, the MUX 710 receives the control signal to connect the input port 720 #1 to the output terminal for outputting the value in the registers 730 #2, 730 #3 and 730 #0 as the feature row 680. The specific value of the output feature row in the following iterations can be deduced by analogy.

Figure 8:
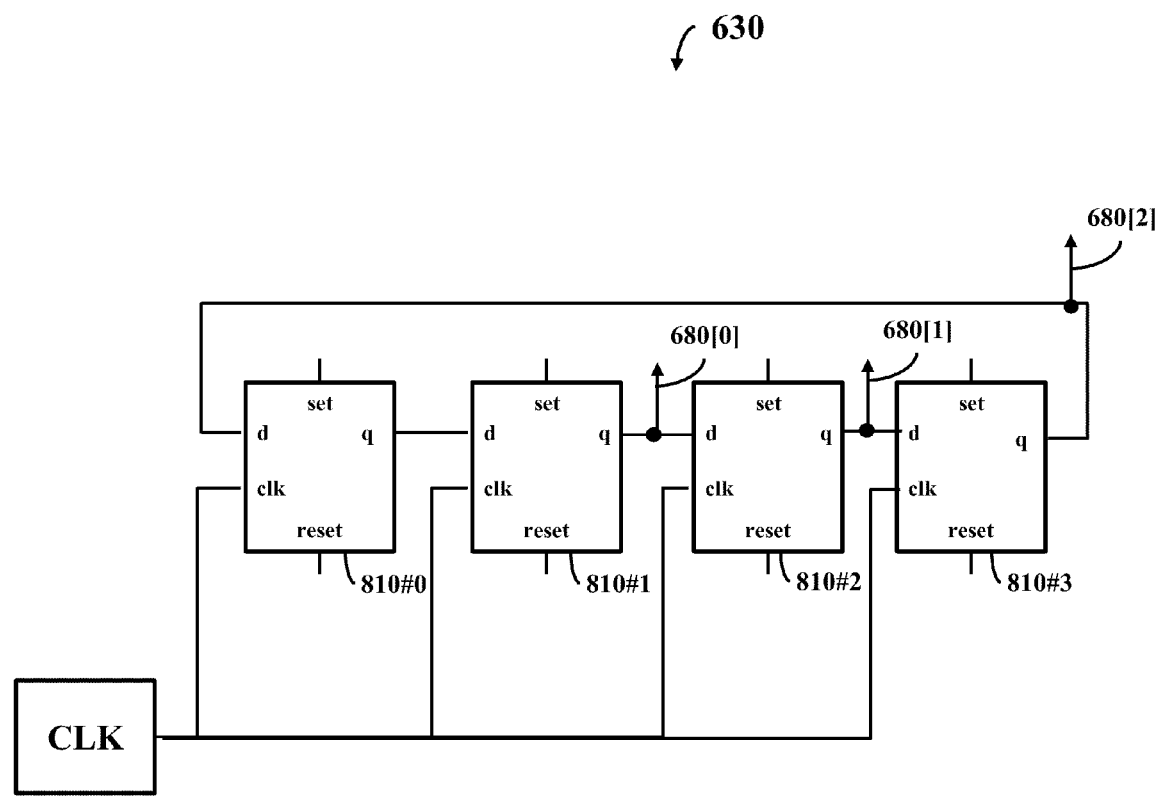

Refer to FIG. 8 showing an embodiment of the feature-row generation circuitry 630 including the bit-shifter connected in series from D flip-flops 810 #0 to 810 #3. The output q of each D flip-flop is connected to the input d of the next D flip-flop, forming a loop. Initially, a controller (not shown in FIG. 8) setups each of the D flip-flops 810 #0 to 810 #3 to store the predefined look-ahead basis. The output of a portion of D flip-flops, for example, the output of the D flip-flops 810 #1, 810 #2 and 810 #3, form the feature row. The controller may set any D flip-flop to store logic "1" or reset any D flip-flop to store logic "0". Subsequently, each D flip-flop outputs the stored value to the next D flip-flop for storage when detecting a change (i.e. a rising edge and/or a falling edge) in the clock signal clk. In each iteration, the outputs 680[0] to 680[2] of the D flip-flops 810 #1 to 810 #3 are sequentially collected as the feature row 680. For example, the controller initially drives the D flip-flops 810 #0 to 810 #3 to store the predefined look-ahead basis "0b0001". The output of the D flip-flops 810 #0 to 810 #3 in the first iteration is "0b001"; in the second iteration is "0b000"; in the third iteration is "0b100"; and in the fourth iteration is "0b010".

Figure 10:
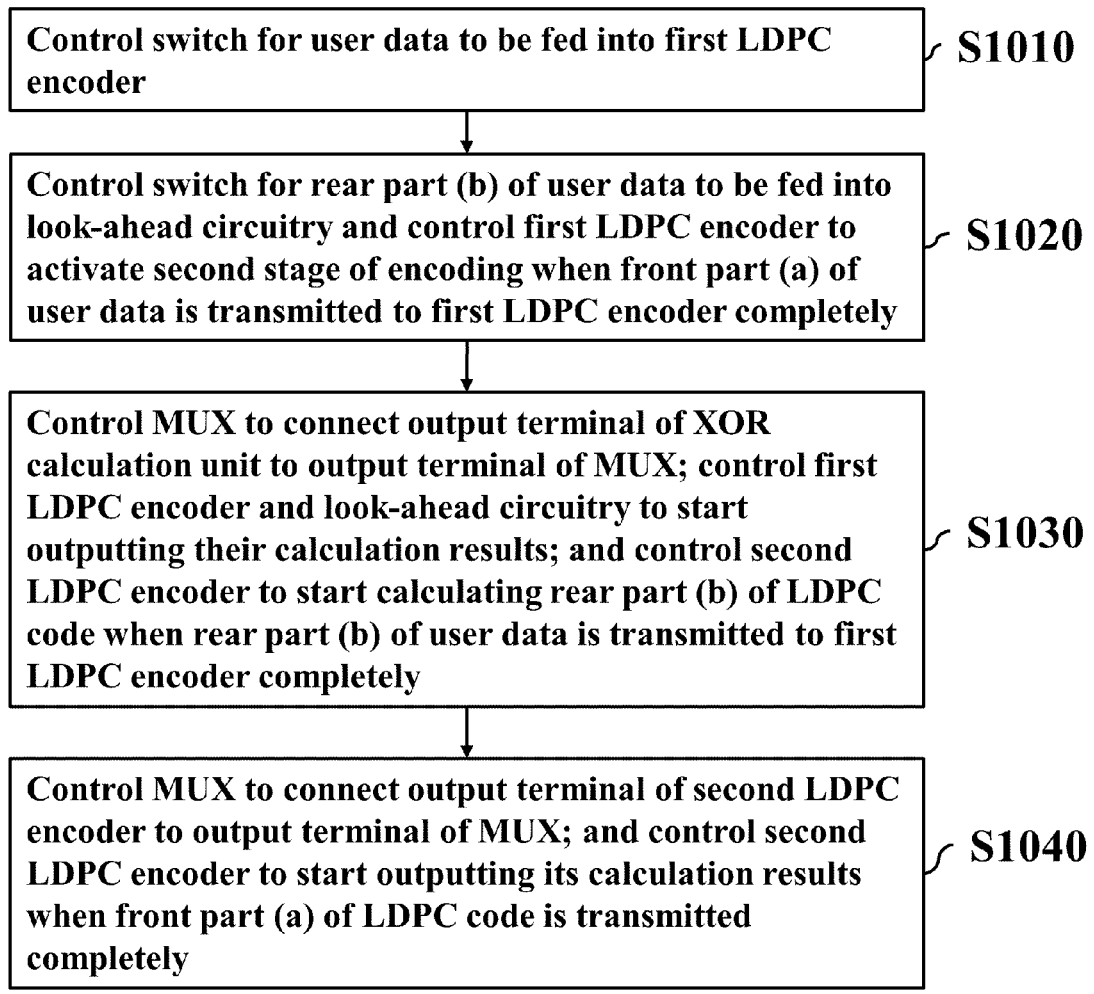
FIG. 10 is a flowchart illustrating a control method according to an embodiment of the invention.

Refer to FIG. 10 illustrating a flowchart of a control method performed by the controller 510. Details are described as follows:

Step S1010: A signal is sent to the switch 520 for the user data 302 to be fed into the LDPC encoder 530 (also referred to as first LDPC encoder).

Step S1020: The switch 520 is controlled to connect the input terminal thereof to the look-ahead circuitry 540 for the rear part (b) 402 #2 of the user data 302 to be fed into the look-ahead circuitry 540 and a signal is issued to the LDPC encoder 530 to activate the second stage of encoding (that is, early start the second stage of encoding) when the front part (a) 402 #1 of the user data 302 is transmitted to the LDPC encoder 530 completely.

Step S1030: The MUX 570 is controlled to connect the output terminal of the XOR calculation circuitry 550 to the output terminal of the MUX 570 for calculation results (that is, the front part (a) 406 #1 of the LDPC code 304) by the XOR calculation circuitry 550 to be programmed into the flash module 150; a signal is issued to the LDPC encoder 530 to start outputting the calculation results 404 #1; and a signal is issued to the look-ahead circuitry 540 to start outputting the calculation results 404 #2; and a signal is issued to the LDPC encoder 560 (also referred to as second LDPC encoder) to start calculating the rear part (b) 406 #2 of the LDPC code 304 when the front part (b) 402 #2 of the user data 302 is transmitted to the LDPC encoder 530 completely.

Step S1040: the MUX 570 is controlled to connect the output terminal of the LDPC encoder 560 to the output terminal of the MUX 570 for the calculation results (that is, the rear part (b) 406 #2 of the LDPC code 304) by the LDPC encoder 560 to be programmed into flash module 150; and a signal is issued to the LDPC encoder 560 to start outputting the calculation results 406 #2 when the front part (a) 406 #1 of the LDPC code 304 is transmitted completely.

Although the embodiment has been described as having specific elements in FIGS. 1, 2, and 5-8, it should be noted that additional elements may be included to achieve better performance without departing from the spirit of the invention. Each element of FIGS. 1, 2, and 5-8 is composed of various circuitries and arranged operably to perform the aforementioned operations. While the process flows described in FIG. 10 include a number of operations that appear to occur in a specific order, it should be apparent that these processes can include more or fewer operations, which can be executed serially or in parallel (e.g., using parallel processors or a multi-threading environment).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An apparatus for generating a Low-Density Parity-Check (LDPC) code, comprising:
    a first LDPC encoder, arranged operably to encode a front part of a user data using a 2-stage encoding algorithm with a parity check matrix to generate a first calculation result;
    a look-ahead circuitry, arranged operably to perform a dot product operation on a rear part of the user data and one of a plurality of feature rows corresponding to the parity check matrix to generate a second calculation result in each iteration; and
    an exclusive-OR (XOR) calculation circuitry, coupled to an output terminal of the first LDPC encoder and an output terminal of the look-ahead circuitry, arranged operably to perform an XOR operation on the first calculation result and the second calculation result to generate a front part of the LDPC code,
    wherein the look-ahead circuitry comprises:
    a data register, arranged operably to store the rear part of the user data;
    a feature-row generation circuitry, arranged operably to generate each feature row according to a look-ahead basis, which is required in each iteration;
    a dot-product calculation circuitry, coupled to the feature-row generation circuitry and the data register, arranged operably to perform a dot product operation on the rear part of the user data and a corresponding feature row to obtain the second calculation result, and output the second calculation result to the XOR calculation circuitry in each iteration; and
    a second controller, coupled to the feature-row generation circuitry, arranged operably to output a control signal in each iteration to the feature-row generation circuitry for driving the feature-row generation circuitry to output the corresponding feature row.

2. The apparatus of claim 1, comprising:
    a second LDPC encoder, arranged operably to encode the user data using the 2-stage encoding algorithm with the parity check matrix to generate a rear part of the LDPC code.

3. The apparatus of claim 2, comprising:
    a multiplexer (MUX), comprising a first input terminal, a second input terminal and a first output terminal, wherein the first input terminal is coupled to an output terminal of the XOR calculation circuitry, the second input terminal is coupled to an output terminal of the second LDPC encoder, and the first output terminal is coupled to a flash module; and
    a first controller, coupled to the MUX, arranged operably to control the MUX to connect the output terminal of the second LDPC encoder to the flash module for the rear part of the LDPC code to be output to the flash module after the front part of the LDPC code is output to the flash module completely.

4. The apparatus of claim 3, comprising:
    a switch, comprising a third input terminal, a second output terminal and a third output terminal, wherein the third input terminal is used to receive the user data, the second output terminal is coupled to an input terminal of the first LDPC encoder, and the third output terminal is coupled to an input terminal of the look-ahead circuitry,
    wherein the first controller is coupled to the switch, the first LDPC encoder and the look-ahead circuitry, and is arranged operably to: control the switch to connect the third input terminal to the third output terminal for the rear part of the user data to be fed into the look-ahead circuitry and issue a first signal to the first LDPC encoder to activate a second stage of encoding when the front part of the user data is transmitted to the first LDPC encoder completely; and issue a second signal to the first LDPC encoder to start outputting the first calculation result to the XOR calculation circuitry and issue a third signal to the look-ahead circuitry to start outputting the second calculation result to the XOR calculation circuitry when the rear part of the user data is transmitted to the look-ahead circuitry completely.

5. The apparatus of claim 4, wherein the third input terminal connects to the second output terminal initially.

6. The apparatus of claim 1,
    wherein the look-ahead basis comprises a subset of the parity check matrix, which is used to encode the rear part of the user data, wherein, except for an initial feature row required in an initial iteration, the feature row required in each iteration is a cyclical right-shifted result of a previous feature row by one bit.

7. The apparatus of claim 6, wherein the parity check matrix comprises a quasi-cyclic (QC) structure.

8. The apparatus of claim 6, wherein a length of the look-ahead basis is $|m_2|+|p_a|-1$, $m_2$ represents a length of the rear part of the user data and $p_a$ represents a length of the front part of the LDPC code.

9. The apparatus of claim 6, wherein the feature-row generation circuitry comprises:
    a source registry, arranged operably to store the look-ahead basis; and
    a multiplexer, comprising a plurality of input ports and one output port, in which each input port is connect to a preset number of registers in the source register through the preset number of physical lines in a specified order, respectively, and arranged operably to connect a designated input port to the output terminal for outputting the corresponding feature row when receiving a control signal.

10. The apparatus of claim 6, wherein the feature-row generation circuitry comprises:
    a plurality of D flip-flops, arranged operably to store the look-ahead basis initially,
    wherein an output terminal of each D flip-flop is connected to an input terminal of a next D flip-flop, forming a loop,
    wherein an output of a portion of the D flip-flops form the corresponding feature row,
    wherein each D flip-flop outputs a stored value to the next D flip-flop when detecting a change in a clock signal.

11. A method for generating a Low-Density Parity-Check (LDPC) code, performed by a controller coupled to a switch, a first LDPC encoder and a look-ahead circuitry, the method comprising:

controlling the switch for a rear part of a user data to be fed into the look-ahead circuitry and issuing a first signal to the first LDPC encoder to activate a second stage of encoding when a front part of the user data is transmitted to the first LPDC encoder completely, wherein the first LDPC encoder is coupled to the switch and is arranged operably to encode the front part of the user data using a 2-stage encoding algorithm with a parity check matrix to generate a first calculation result, wherein the look-ahead circuitry is coupled to the switch, and is arranged operably to perform a dot product operation on the rear part of the user data and one of a plurality of feature rows corresponding to the parity check matrix to generate a second calculation result in each iteration; and issuing a second signal to the first LDPC encoder to start outputting the first calculation result to an exclusive-OR (XOR) calculation circuitry and issuing a third signal to the look-ahead circuitry to start outputting the second calculation result to the XOR calculation circuitry when the rear part of the user data is transmitted to the look-ahead circuitry completely, wherein the XOR calculation circuitry is coupled to the first LDPC encoder and the look-ahead circuitry and is arranged operably to perform an XOR operation on the first calculation result and the second calculation result to generate a front part of the LDPC code, wherein the look-ahead circuitry performs operations:

storing the rear part of the user data;

generating each feature row according to a look-ahead basis, which is required in each iteration;

performing a dot product operation on the rear part of the user data and a corresponding feature row to obtain the second calculation result, and outputting the second calculation result to the XOR calculation circuitry in each iteration; and outputting a control signal in each iteration to the feature-row generation circuitry for driving the feature-row generation circuitry to output the corresponding feature row.

12. The method of claim 11, comprising:

controlling a multiplexer (MUX) to couple a second LDPC encoder to a flash module for a rear part of the LDPC code to be output to the flash module when the front part of the LDPC code is output to the flash module completely, wherein input terminals of the MUX are coupled to the XOR calculation circuitry and the second LDPC encoder, wherein a output terminal of the MUX is coupled to the flash module, wherein the second LDPC encoder is arranged operably to encode the user data using the 2-stage encoding algorithm with the parity check matrix to generate the rear part of the LDPC code.

13. The method of claim 11, wherein the parity check matrix comprises a quasi-cyclic (QC) structure.

14. The method of claim 13, wherein, except for an initial feature row required in an initial iteration, the feature row required in each iteration is a cyclical right-shifted result of a previous feature row by one bit.

15. The method of claim 11, wherein the switch is initially coupled to the first LDPC encoder for the user data to be fed into the first LDPC encoder.

16. The method of claim 11, wherein the look-ahead circuitry comprises:

a data register, arranged operably to store the rear part of the user data;

a feature-row generation circuitry, arranged operably to generate each feature row according to the look-ahead basis, which is required in each iteration;

a dot-product calculation circuitry, coupled to the feature-row generation circuitry and the data register, arranged operably to perform the dot product operation on the rear part of the user data and the corresponding feature row to obtain the second calculation result, and output the second calculation result to the XOR calculation circuitry in each iteration; and a second controller, coupled to the feature-row generation circuitry, arranged operably to output the control signal in each iteration to the feature-row generation circuitry for driving the feature-row generation circuitry to output the corresponding feature row.

17. The method of claim 16, wherein the look-ahead basis comprises a subset of the parity check matrix, which is used to encode the rear part of the user data, wherein, except for an initial feature row required in an initial iteration, the feature row required in each iteration is a cyclical right-shifted result of a previous feature row by one bit.

18. The method of claim 17, wherein a length of the look-ahead basis is $|m_2|+|p_a|-1$, $m_2$ represents a length of the rear part of the user data and $p_a$ represents a length of the front part of the LDPC code.

19. The method of claim 16, wherein the feature-row generation circuitry comprises:

a source registry, arranged operably to store the look-ahead basis; and a multiplexer, comprising a plurality of input ports and one output port, in which each input port is connect to a preset number of registers in the source register through the preset number of physical lines in a specified order, respectively, and arranged operably to connect a designated input port to the output terminal for outputting the corresponding feature row when receiving a control signal.

20. The method of claim 16, wherein the feature-row generation circuitry comprises:

a plurality of D flip-flops, arranged operably to store the look-ahead basis initially, wherein an output terminal of each D flip-flop is connected to an input terminal of a next D flip-flop, forming a loop, wherein an output of a portion of the D flip-flops form the corresponding feature row, wherein each D flip-flop outputs a stored value to the next D flip-flop when detecting a change in a clock signal.

* * * * *